United States Patent [19]

Uchida

[11] Patent Number: 4,894,804
[45] Date of Patent: Jan. 16, 1990

[54] RESETTING ARRANGEMENT FOR A SEMICONDUCTOR INTEGRATED CIRCUIT DEVICE HAVING SEMICONDUCTOR MEMORY

[75] Inventor: Makio Uchida, Tokyo, Japan

[73] Assignee: Hitachi, Ltd., Tokyo, Japan

[21] Appl. No.: 212,575

[22] Filed: Jun. 28, 1988

Related U.S. Application Data

[63] Continuation of Ser. No. 860,411, May 7, 1986, Pat. No. 4,758,990.

[30] Foreign Application Priority Data

May 7, 1985 [JP] Japan .................................. 60-95487

[51] Int. Cl.$^4$ .............................................. G11C 7/00
[52] U.S. Cl. ................................ 365/190; 365/189.04
[58] Field of Search ............... 365/189, 190, 202, 203, 365/154, 189.04, 218

[56] References Cited

U.S. PATENT DOCUMENTS

| | | | |
|---|---|---|---|
| 4,150,441 | 4/1979 | Ando | 365/203 X |
| 4,625,298 | 11/1986 | Sumi | 365/190 |
| 4,758,990 | 7/1988 | Uchida | 365/190 |

Primary Examiner—Joseph A. Popek
Attorney, Agent, or Firm—Antonelli, Terry & Wands

[57] ABSTRACT

A semiconductor integrated circuit device having a semiconductor memory wherein part of the operation of a half precharge circuit is stopped by a reset signal, complementary data lines are set to high and low levels and a plurality of word lines are simultaneously brought into a selection state in order to effect a reset operation at a high speed.

31 Claims, 2 Drawing Sheets

RESETTING ARRANGEMENT FOR A SEMICONDUCTOR INTEGRATED CIRCUIT DEVICE HAVING SEMICONDUCTOR MEMORY

This is a continuation of application Ser. No. 860,411, filed May 7, 1986, now U.S. Pat. No. 4,758,990.

BACKGROUND OF THE INVENTION

This invention relates generally to a semiconductor integrated circuit device having a semiconductor memory, and more particularly to a technique which can be effectively utilized for a static type RAM (random access memory) used in digital integrated circuits, for example.

Each memory cell in an MOS static RAM consists, for example, of a static type flip-flop circuit which in turn consists of a pair of driving MOSFETs whose gates and drains are cross-connected with one another and their load elements, and a pair of transfer gate MOSFETs. A memory array includes a plurality of these memory cells that are arranged in matrix, and a plurality of complementary data line pairs. The input-/output terminals of memory cells are coupled to the complementary data lines corresponding thereof (see Japanese Patent Laid-Open No. 198594/1982).

It has been examined to build the static type RAM in a large scale digital integrated circuit used in compact or medium scale computers, and to let them operate in the same way as registers. In this case, since the RAM is used in the same manner as registers, their stored data must be often reset. Here, there occurs the problem that a relatively long period of time is necessary using the conventional method for resetting all the bits because the addresses of RAMs are sequentially selected and write of a reset signal (e.g. a logic "0") is effected for each such address. Therefore, it has been considered to provide a flip-flop circuit with an offset on the "0" side and to again turn on its power source after it is once cut off. In this case, the operation margin of the memory cell becomes small due to setting of the offset. Since the power source must be cut off before reset, other problems develop in that large noise occurs in a power line and the memory content of other RAMs can be destroyed when reset is carried out during the operation.

SUMMARY OF THE INVENTION

It is an object of the present invention to provide a semiconductor integrated circuit device having a semiconductor memory which accomplishes a high speed reset operation by a simple construction.

The above and other objects and novel features of the present invention will become more apparent from the following description to be taken in conjunction with the accompanying drawings.

Among the inventions disclosed herein, a typical example of the inventions is as follows.

The state in which both high and low levels are supplied to complementary data lines is established by a reset signal and a plurality of word lines are simultaneously brought into a selection state in order to accomplish the high speed reset operation.

DESCRIPTION OF THE PREFERRED EMBODIMENTS

Figure 1:
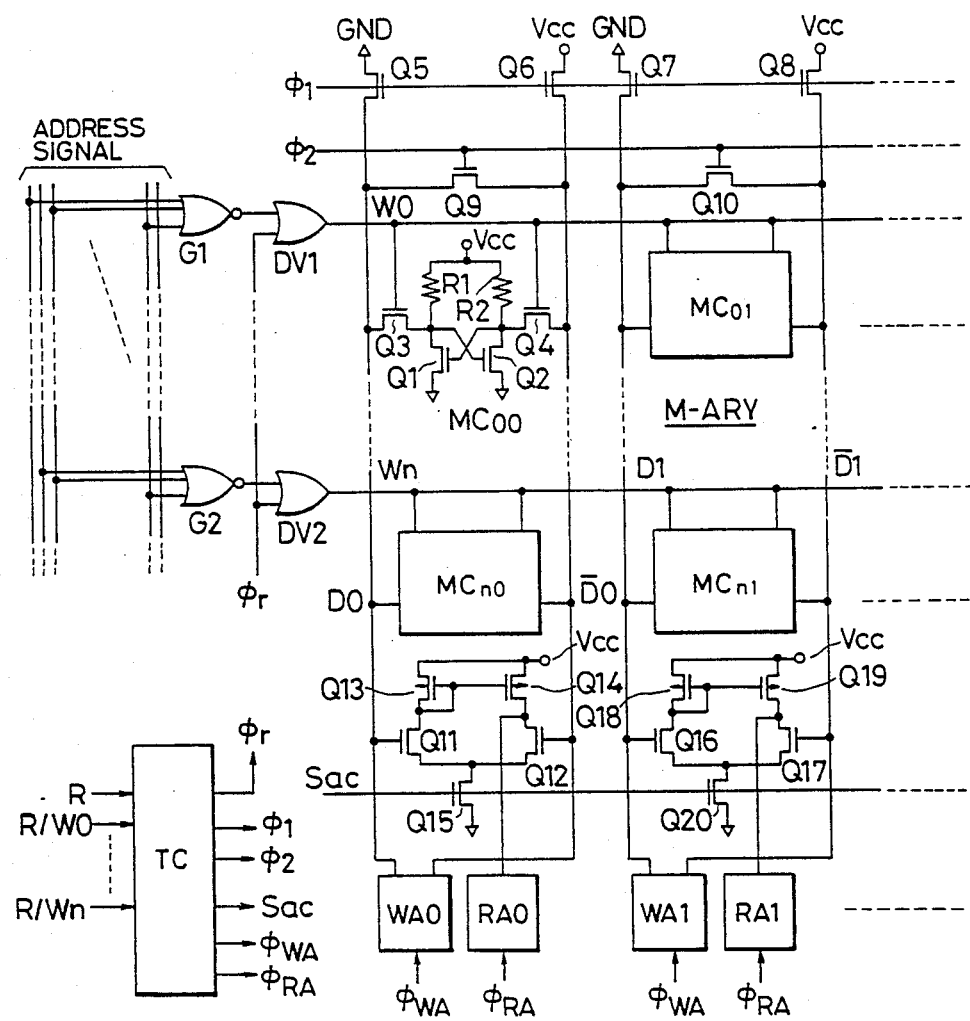
FIG. 1 is a circuit diagram showing a semiconductor memory circuit of one embodiment of the present invention.

FIG. 1 shows a circuit diagram of one embodiment of the present invention. The RAM in this drawing is fabricated on one semiconductor substrate made of a single crystal silicon by known CMOS (complementary metal oxide semiconductor) integrated circuit (IC) techniques, though not particularly limited thereto. Each MOSFET is produced by the so-called "self-alignment" technique using its gate electrode comprising polycrystalline silicon as a kind of mask for doping an impurity.

Each MOSFET constituting the memory cell is of an N-channel type, and is formed in a P-type well region formed in an N-type semiconductor substrate. A P-channel MOSFET is formed in the N-type semiconductor substrate. The P-type well region as the body gate of the N-channel MOSFET is connected to a ground terminal of the circuit, and the N-type semiconductor substrate as the common body gate of the P-channel MOSFETs is connected to a power source terminal of the circuit. Incidentally, the structure in which each MOSFET constituting the memory cell is formed in the well region is effective for preventing the inversion of stored data of the memory cell which is induced by $\alpha$-particles or the like.

The memory array M-ARY comprises a plurality of memory cells MC that are illustrated as an example and arranged in matrix, word lines W0 through Wn comprising polycrystalline silicon layer, and complementary data lines D1 and $\overline{D1}$, . . . .

Each of the memory cells MC has the same construction, and its concrete circuit is shown as a typical example by a memory cell $MC_{00}$. Each memory cell comprises memory MOS FETs Q1, Q2 whose gates and drains are cross-coupled with one another and whose sources are connected to the ground potential of the circuit, and high resistors R1, R2 made of polycrystalline silicon layers and disposed between the drains of MOSFETs Q1, Q2 and a power source terminal Vcc. Transfer gate MOSFETs Q3, Q4 are disposed between the drains of MOSFETs Q1, Q2 and complementary data lines D0, $\overline{D0}$, respectively. The gates of transfer gate MOSFETs such as Q3, Q4 that are disposed in the same row are connected in common to corresponding word line W0 or Wn illustrated typically, respectively. The input and output terminals of the memory cells disposed in the same column are connected to the pair of corresponding complementary data (or bit) lines D0 and $\overline{D0}$, D1 and $\overline{D1}$, and the like, respectively.

In each memory cell, MOSFETs Q1, Q2 and the resistors R1, R2 constitute a kind of a flip-flop circuit, but its operating point in the data storage state is considerably different from that of flip-flop circuits in an ordinary sense. In other words, in the memory described above, the resistor R1 has such a high resistance (e.g. 1 to 10 giga ohms, although this is not limitative) that the gate voltage of MOSFET Q2 can be kept at a voltage a little bit higher than its threshold voltage when MOSFET Q1 is turned off, in order to reduce the power consumption of the memory cell. Similarly, the resistor R2, too, has high resistance. In other words, these resistors R1, R2 have high resistance so that it can compensate for the drain-leak current of MOSFETs Q1, Q2.

The resistors R1, R2 have the current supply capacity to such a level that they can prevent the discharge of the stored charge stored in the gate capacity (not shown) of MOSFETs Q1, Q2.

In accordance with this embodiment, each memory cell MC comprises the N-channel MOSFETs and the polycrystalline silicon resistor elements, though the RAM is produced by CMOS-IC techniques.

P-channel MOSFETs can be used in place of the polycrystalline silicon resistor elements described above. In accordance with this embodiment, the sizes of the memory cells and memory array can be reduced. When the polycrystalline silicon resistors are used, they can be formed over the driving MOSFET Q1 or Q2 and the size of the resistors can be reduced. If P-channel MOSFETs are used, they are disposed apart from the driving MOSFETs Q1, Q2 with a relatively large space. But this embodiment eliminates such a necessity and hence an unnecessary space can be eliminated. When P-channel MOSFETs are used, on the other hand, they can be formed simultaneously with MOSFETs Q13 and Q14 described later, and the like. Therefore, the production process can be simplified.

In the FIG. 1, a NOR gate circuit G1 as a unit circuit for constituting an address decoder generates a selection signal for word lines. This word line selection signal is transmitted to a corresponding word line W0 through a driving circuit DV1 that generates a driving signal for the word lines. This also holds true of the other word line Wn illustrated as a typical example. The address decoder comprises the NOR gate circuits G1, G2 and the gate. that are analogous to one another. A predetermined combination of complementary address signals each having a plurality of bits are supplied from an address bus, not shown, to the input terminals of these NOR gate circuits G1, G2. The address decoder decodes the complementary address signals and generates the selection signal for one word line. In order to accomplish a high speed reset operation as will be described elsewhere, the driving circuits DV1, DVn, etc. are constructed of OR gate circuits and transmit the word selection signals or reset signal $\phi r$ described later to corresponding word lines.

A pair of complementary data lines D0, $\overline{D0}$ and D1, $\overline{D1}$ of the memory array are connected directly to the input terminals of a differential sense amplifier, though not particularly limitative. In other words, the complementary data lines D0, $\overline{D0}$ are connected to the gates of N-channel differential amplification MOSFETs Q11, Q12. An active load circuit constructed of P-channel MOSFETs Q13, Q14 in a current mirror form are connected to the drains of these transistors MOSFETs Q11, Q12. An N-channel power switch MOSFET Q15 is disposed between the common source of these differential amplification MOSFETs Q11, Q12 and the ground potential point of the circuit. This transistor Q15 is turned on by a timing signal Sac, thereby, the sense amplifier, that is, the differential amplification MOSFETs Q11 and Q12, are rendered operative. A similar sense amplifier constructed of MOSFETs Q16–Q20 are connected to the complementary data lines D1, $\overline{D1}$ illustrated as other typical examples.

The amplification output signal of the sense amplifier is sent to an internal data bus (described later) through read circuits RA0, RA1 or the like. Each of the read circuits RA0, RA1 has a function of holding the output signal (latch function) and a function of driving the internal data bus, and is controlled by a control signal $\phi$RA. In other words, when the circuit is in the read mode by the signal $\phi$RA, the read circuit RA0, RA1 are operative, while its output terminal is kept in a high impedance or floating state at other times.

The output terminals of write circuits WA0, WA1 are connected to the complementary data lines D0, $\overline{D0}$ and D1, $\overline{D1}$. The operation of each write circuit WA0, WA1 is controlled by a control signal $\phi$WA. The write circuits WA0, WA1 output complementary data signals corresponding its write data signal to the complementary data lines D0, $\overline{D0}$ and D1, $\overline{D1}$ when the circuit is in the operative mode, that is, in the write mode. The write data signal is supplied from the internal data bus. When the write circuits WA0, WA1 are in the nonoperative state, that is, in the data storage state or the data read state, its pair of output terminals are kept in a high impedance state or floating state. The write circuits WA0, WA1 have a function of holding the write data signal (latch function), a function of generating the complementary data signals and a function of writing data into the memory cell.

The following pre-charge circuit is disposed for the pairs of complementary data lines D0, $\overline{D0}$ and D1, $\overline{D1}$ in this embodiment.

The power source voltage Vcc and the ground potential GND of the circuit are respectively supplied to the pair of complementary data lines $\overline{D0}$ and D0 through N-channel MOSFETs Q6 and Q5 that are controlled by a first timing signal $\phi1$, though the arrangement is not particularly limitative. MOSFETs Q7, Q8 similar to MOSFETs Q5, Q6 are disposed for the other pair of complementary data lines D1, $\overline{D1}$. MOSFETs Q6, Q8 for supplying the power source voltage may be of the P-channel type. In such a case, the power source voltage Vcc can be supplied as it is without being reduced by a voltage corresponding to the threshold voltage, and an inversion signal of the signal $\phi1$ is supplied to the gate of the P-channel MOSFET.

An N-channel MOSFET Q9 for receiving a second timing signal $\phi2$ is interposed between the complementary data lines D0 and $\overline{D0}$. Similarly, a similar MOSFET Q10 is interposed between the other complementary data lines D1, $\overline{D1}$.

A timing control circuit TC receives the reset signal R and the read/write signal R/W0–R/Wn and generates the precharge signals $\phi1$, $\phi2$ necessary for operations, the reset signal $\phi r$, the read/write circuit control signals $\phi$RA/$\phi$WA and the sense amplifier operation control signals Sac.

Figure 2:
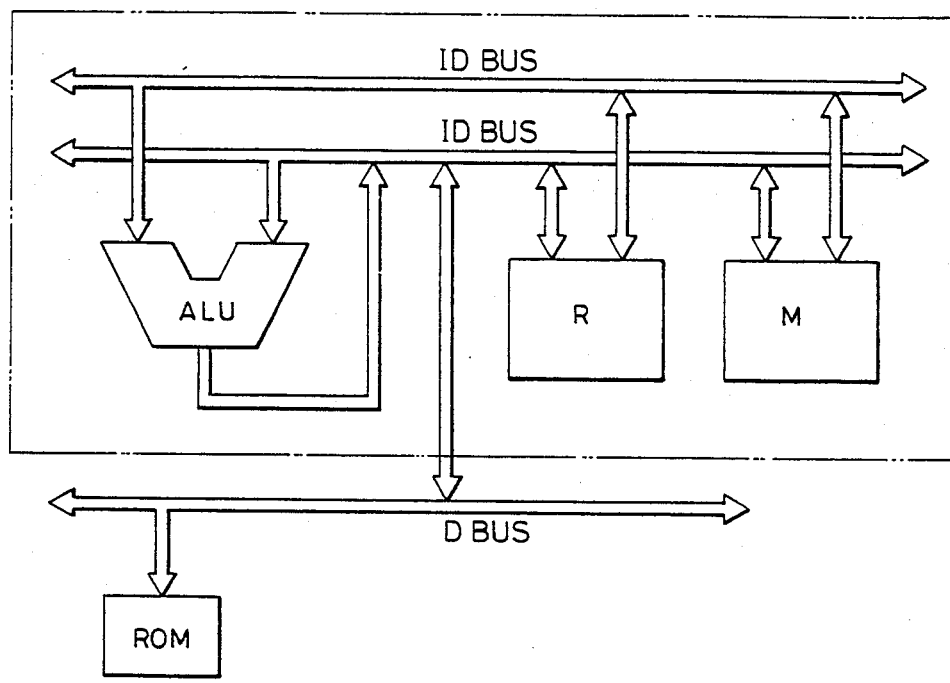
FIG. 2 shows a digital integrated circuit in which the circuit shown in FIG. 1 is used.

The semiconductor memory shown in FIG. 1 is used as a whole as a data register group R shown in FIG. 2, though not particularly limitative.

FIG. 2 shows the data flow in a small or medium scale computer, particularly in its arithmatic unit. Each of the circuit blocks, that is, an arithmetic logic unit ALU, the data register group R and a random access memory M, is formed on one large-scale integrated circuit (LSI) chip represented by two dot-and-dash line. In the FIG. 2, the internal address bus and an internal control bus disposed between each of the circuit blocks are omitted and only the internal data bus ID BUS is shown. The internal address bus supplies the address signal to the address decoder shown in FIG. 1, for example. The internal control bus supplies the signals R, R/W0–R/Wn to the timing control circuit TC shown in FIG. 1, for example. The internal data bus ID BUS supplies the write data to the write circuit WA shown in FIG. 1 and receives the read data from the read circuit RA. Incidentally, only the data bus D BUS is shown disposed outside the LSI chip while the address bus and the control bus are omitted.

The arithmetic logic unit ALU is connected to the register group R and to the memory M by two internal data buses ID BUS of the arithmatic unit. One of the internal data buses ID BUS is connected to the data bus D BUS and is further connected to other LSI chips such as the random access memory chip, the logic circuit chip shown in FIG. 2 and the control unit ROM through the data bus D BUS. The control unit ROM uses a micro-program stored in a read only memory and generates a micro-instruction in accordance with the data supplied thereto. The micro-instruction is supplied as the control signal to the arithmatic and control units through the control bus. The ALU makes arithmetic and logic operation using the data supplied thereto from the register group R, the memory M and the like, and outputs its result. The output of the ALU is supplied to the ALU, the register group R, the memory M and the data bus D BUS outside the LSI chip through one of the internal data buses ID BUS.

The register group R is constituted in the following manner using the circuit shown in FIG. 1, though the construction is not particularly limitative.

In FIG. 1, the number of the complementary data pairs is 36, for example, and the number of word lines is 64. Therefore, the circuit has a $36 \times 64$ bit memory capacity. The RAM in FIG. 1 is used as 64 registers each consisting of 36 bits. In other words, 36 memory cells connected to the same word line are regarded as one register. Among the 36 bits, 32 bits are used for temporary storage and the other 4 bits for the parity check. The 32 memory bits are divided by four bytes (8 bits) into four groups. One parity bit is added to each byte.

In this embodiment, the write/read operation is effected in a 9-bit unit (one byte plus one parity bit), and the read/write circuit WA0, WA1 . . . and RA0, RA1 . . . and its control signals are correspondingly divided into four groups such as $\phi RA0$–$\phi RA3$ and $\phi WA0$–$\phi WA3$ (not shown). The read circuit RA and the write circuit WA are connected to the two internal data buses ID BUS through the selection circuit not shown in the drawing. This selection circuit is controlled by the signal which is generated on the basis of the signal R/W0–R/Wn. The selection circuit determines which internal data bus is to be connected to the read circuit or write circuit of which byte.

Figure 3:
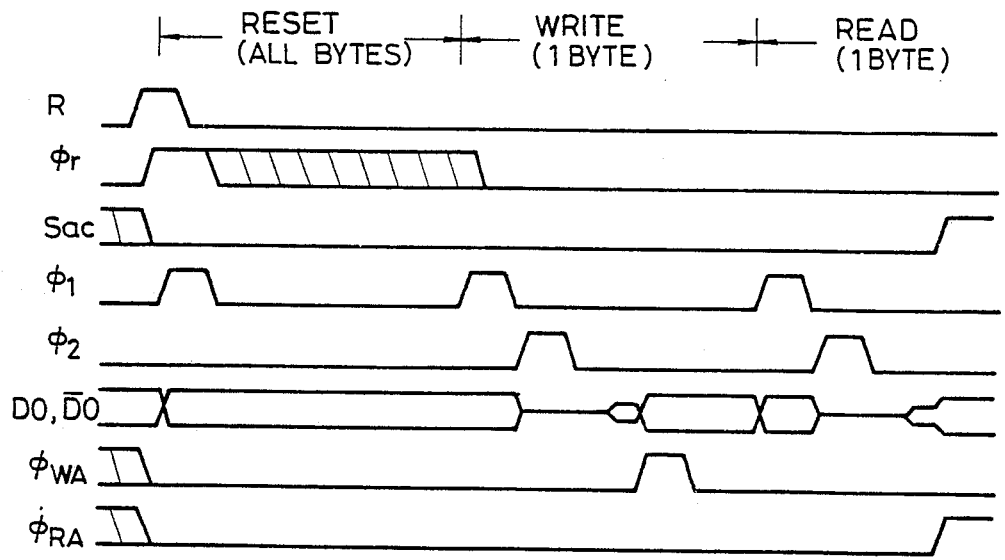
FIG. 3 is a timing chart showing an example of the operations of the circuit shown in FIG. 1.

Next, an example of the circuit operation of the circuit shown in FIG. 1 will be explained with reference to a schematic timing chart shown in FIG. 3.

First of all, the case where the stored data of all the memory cells of the RAM constituting the register group R are reset to the logic "0" before the start of a desired operation (an operation by a new program) of the digital integrated circuit such as shown in FIG. 2 will be explained.

The first signal $\phi 1$ for precharging the data line is generated with a predetermined interval. The interval from the generation of one signal $\phi 1$ to the generation of the next signal $\phi 1$ can be regarded as a cycle for effecting one operation, that is, one machine cycle.

The reset signal R is raised to the high level before the start of the reset cycle. Therefore, the timing control circuit TC brings the signals Sac, $\phi WA$ and $\phi RA$ to the low level and renders inoperative all (36) of the sense amplifiers, the write circuits WA and the read circuits RA. However, since the sense amplifier is inoperative, the read circuit RA may be in the operative state (with the signal $\phi RA$ being at the high level) during the reset cycle, if desired. As the reset signal R rises to the high level, the timing control cirucit TC raises the reset signal $\phi r$ to the high level, so that all (64) of the word lines W0–Wn are at the high level, that is, under the selection state, irrespective of the outputs of the unit circuits G1, G2 of the decoder.

After a suitable period from the change of the signal R to the high level, the precharge signal $\phi 1$ changes to the high level. All the precharge MOSFETs Q5–Q8 are turned on and the complementary data lines $\overline{D0}$ and the like are changed to the high level and the complementary data lines D0 and the like to the low level. The potential of each data line is set at a predetermined potential irrespective of the potential given thereto in the previous cycle. Since all the word lines are selected in advance, the logic "0" is written into all the memory cells MC in accordance with the low level of the complementary data line D0 and the like and the high level of the complementary data line $\overline{D0}$ and the like.

The precharge MOSFETs Q5–Q8 have a large current supply capacity (for example, on the order to 2 mA) in order to charge a large parasitic capacitance of the data lines. Therefore, the size of these precharge MOSFETs Q5–Q8 are somewhat increased to increase the current supply capacity and the data can be written sufficiently into all (64) of the memory cells. For example, in a case where Q5–Q8 are all N-channel MOSFETs, the channel width and channel length can be 40 micron and 1.3 micron. On the other hand, in a case where Q5 and Q7 are N-channel MOSFETs and Q6 and Q8 are P-channel MOSFETs, the channel width and channel length of the P-channel MOSFETs are 100 micron and 1.3 micron and those of the N-channel MOSFETs are 40 micron and 1.3 miron. Of course, the present invention is not limited to these values. Incidentally, the signal $\phi r$ may drop to the low level in synchronism with the signal $\phi 1$ as shown in FIG. 3, and may be such a signal whose level drops to the low level before the signal $\phi 2$ is generated in the cycle next to the reset cycle.

By the operations described above, the reset operation of all the memory cells is completed in one machine cycle. The access to the register group R and each circuit on the same LSI chip is inhibited during this reset cycle. To accomplish this inhibiting, the signal $\phi r$ makes all the outputs of the decoder the high level, and the signals $\phi wa$ and $\phi ra$ make the circuits WA and RA inoperative. (This state is similar to the precharge mode.) Any address signals on the internal address bus and any data signals on the internal data bus are then substantially rejected from the register group R. Since this reset operation does not require the power to be cut off before the reset operation is carried out, the memory R formed in the same LSI chip can be continuously stored in the memory cells, and the aforementioned disadvantages do not occur. Since this reset operation is not resetting by the address selection, the reset time is short. In a case where the reset cycle is carried out on the one bit basis, 2,304 ($=64 \times 36$) machine cycles are necessary. In the case where the potential for the reset operation is applied to all the data lines and the word lines are sequentially selected for the reset operation, 64 machine cycles are necessary. In accordance with these reset methods, the cycle number necessary for the reset operation increases if the number of memory cells or word lines increases. In accordance with the above-described embodiment of the present invention, however, the reset operation can be completed within one machine cycle even when the scale of the register group R is great.

The write operation is effected after resetting. This write operation can be made for each byte (plus one parity bit) as described already. First of all, the first timing signal $\phi 1$ is changed to the high level, the MOSFETs Q5–Q8 are turned on in response to the former with the data lines $\overline{D0}, \overline{D1}, \ldots$ being at the high level while the data lines D0, D1, ... being at the low level such as the ground potential of the circuit (as the data line potential does not change from the reset level). These MOSFETs Q5–Q8 are turned off when the timing signal $\phi 1$ described above changes to the low level. As a result, the complementary data lines (D0, $\overline{D0}$, D1, $\overline{D1}, \ldots$) keep the levels described above under the floating state.

Thereafter, the second timing signal $\phi 2$ is raised to the high level, and all the MOSFETs Q9, Q10, etc. are turned on. Then, the complementary data lines are precharged to a middle level formed by short-circuiting the high level to the low level.

Though not shown in the drawing, one word line is brought into the selection state after completion of the precharge described above and one memory cell is connected to each complementary data line. As a result, the potentials of the complementary data lines have a very small potential difference in accordance with the data stored in the memory cell (the logic "0", that is, the reset signal).

The signal $\phi WA$ is raised to the high level after (or simultaneously with) the selection of the word line. As the signal $\phi WA$, the signal corresponding to one byte (such as only the signal $\phi WA0$, for example) or signals corresponding to a plurality of bytes (such as a plurality of arbitrary signals among the signals $\phi WA0$ through $\phi WA3$) may be set to the high level. The write circuit WA designated by the high level of the signal $\phi WA$ is connected to each complementary data line. The write data such as the logic "1" is applied in advance to the write circuit WA from the internal data bus ID BUS through the selection circuit. The complementary data lines (e.g. D0 and $\overline{D0}$) are set to the high and low levels in response to the write data. Therefore, the logic "1" is written into the memory cell. Since the sense amplifier is rendered inoperative by the low level of the signal Sac, the current capacity of the write circuit WA need not be very great.

After the appropriate write operation, the read operation is effected. The read operation can be made for each byte (plus one parity bit).

First of all, the complementary data lines are precharged to the half level between the high and low levels by the signals $\phi 1$ and $\phi 2$ in the same way as in the write operation. If the potential corresponding to the logic "1" has been given in the previous cycle, the potential of the complementary data line once inverts due to the high level of the signal $\phi 1$.

Though not shown in the drawing, one of the word lines is brought into the selection state after the precharge described above and one memory cell is connected to the complementary data lines (D0, $\overline{D0}$). As a result, the complementary data lines come to have a fine potential difference in accordance with the stored data (e.g. the logic "1"). Thereafter, the control signal Sac is set to the high level, and each sense amplifier is rendered operative and amplifies the small read-out voltage appearing between the complementary data lines D0, $\overline{D0}$ to output it to the internal data bus ID BUS through the read circuit RA0 or the like that is rendered operative by the signal $\phi RA$.

The resetting method of this embodiment makes it possible to periodically generate the signal $\phi 1$ irrespective of the reset operation and to temporarily stop the occurrence of the signal $\phi 2$ by the reset signal R. In other words, in accordance with this embodiment, the operation (half precharge operation) is carried out constantly to obtain the half precharge voltage by short-circuiting the data lines after they are precharged to the high and low levels. Only the generation of the signal $\phi 2$ for the short-circuit of the complementary data lines is stopped by reset signal R. Therefore, the cycle corresponding to the signal $\phi 1$ for this precharge is used as the reset cycle. In this case, the potential of the complementary data lines must always be constant by the signal $\phi 1$.

The present invention provides the following effects.

(1) The invention can reset easily a large number of memory cells at a high speed by utilizing the level setting operation of the complementary data lines to the high and low levels in accordance with the half precharge system and the simultaneous selection operation of a plurality of word lines without using the input/output circuit.

(2) Since an offset is not set to the memory cell, as required in some other systems, the operation margin can be greatly secured in the normal operation.

(3) Since the reset operation is effected by the control signal R, the high speed reset operation can be accomplished at an arbitrary timing under the turn-on state of the power.

(4) The invention utilizes the partial write selection signal which divides the complementary data lines into a plurality of pairs and makes access in a smaller bit unit, in order to make the reset operation of the complementary data lines to the high and low levels in the corresponding half precharge operation described above. Therefore, the noise level occurring in the power line or in the ground line of the circuit can be reduced.

Although the invention has thus been described in its preferred form, it is not particularly limited to the foregoing embodiment but can of course be practised in various modificiations without departing from the gist and scope thereof.

For example, the reset operation can be made at arbitrary timings such as at the turn-on of the power, the start of the system, the end of execution of one program or calculation, and so forth. Since the reset operation is completed in one machine cycle, the access to the LSI chip is inhibited in the interim and the reset signal R may be generated during this period.

The precharge level of the half potential level may be obtained by eliminating the generation of the signal $\phi 1$ and generating the signal $\phi 2$ in the cycle immediately after the reset operation.

Furthermore, the generation of the signal $\phi 1$ can be omitted in the operations other than the reset operation, that is, in the read or write operation. In such a case, the potential of the complementary data lines remaining from the previous operation cycle is short-circuited to precharge them to the half level. Therefore, the read operation from the memory cell, the amplification operation by the sense amplifier and the write operation which sets the complementary data lines to the high and low levels in accordance with the write signal can be sped up.

The potential of the data lines for the reset operation may be provided by use of the write circuit WA. Namely, the data (e.g. the logic "0") corresponding to the reset level is applied in advance to the write circuit WA from the internal data bus ID BUS. Thereafter, the complementary data signals are applied from the write circuit WA to the complementary data lines by the reset signal R, and all the word lines are brought into the selection state by the signal φr. In this case, the write circuit must be large in scale. If the internal data bus ID BUS is smaller than 36 bits, several machine cycles are necessary for the reset operation.

When all the bits are to be simultaneously reset, a relatively large current flows due to the substantial write operation to a large number of memory cells, and noise will occur in the power supply line or the ground line of the circuit. Where such a noise is a problem, the control signals R/W0 through R/W3 for the read/write operation in the 9 bit unit described above are set selectively to the low level. In other words, the precharge MOSFETs are similarly divided into four groups, and their timing signals φ1 and φ2 are selectively supplied to the precharge MOSFETs of the respective groups (1 byte and 1 parity bit) in accordance with the levels of the control signals R/W0-R/W3. For example, if the reset signal R is set to the high level, only the control signal R/W0 is set to the high level and the other to the low level, only the precharge MOSFETs disposed in the nine pairs of complementary data lines corresponding to the control signal R/W0 are turned on and the logic "0" is written into 9×64 memory cells. The same operation is effected while setting sequentially the control signals R/W1-R/W3 to the high level, so that the four operation cycles in all can reset all the bits.

Needless to say, the reset operation may be completed only by reset of nine bits.

Reset of the bit selected from inside one register is also effective for the following case. There is the case where such an information processing instruction exists which nullifies the information of the memory cells connected to the same word line or the information which the bit belongs to if the specific bit is the logic "0". For example, a specific 2 bits (i.e. MSB and next bit) of 36 bits can be used as a flag which shows whether the other 34 bits are valid data or invalid data. The ALU fetches the specific 2 bits first through the ID BUS, and then decides whether to read the other 34 bits or not according to the content of the specific 2 bits. In this case, the reset of the specific 2 bits without any change of other 34 bits can be regarded as the reset operation of all bits because the other 34 bits have no meaning if the specific 2 bits instruct the ALU that the other 34 bits are invalid.

Various modifications may be made for the read and write circuits for the input/output operations of the data signals.

Although the description given above primarily deals with the example wherein the invention is applied to RAM incorporated in the digital integrated circuit as the technical background of the invention, the present invention is not particularly limited thereto, but can of course be applied similarly to RAMS incorporated in one-chip microcomputers, semiconductor memory devices as external memory devices, and so forth.

I claim:
1. A static memory comprising:
 a plurality of static type memory cells which store data therein;
 a plurality of word lines and a plurality of pairs of complementary data lines coupled to said plurality of memory cells so that each static type memory cell is coupled to a word line and a pair of complementary data lines; and
 selecting means coupled to said plurality of word lines including decoder means responsive to address signals for selecting one of said plurality of word lines and further including simultaneous selection means responsive to a control signal for simultaneously bringing predetermined word lines into a selection state.

2. A static memory according to claim 1, wherein each of said plurality of static type memory cells comprises a flip-flop circuit including a pair of N-channel MOSFETs having gates and drains thereof cross-coupled and load elements coupled to the drains of said pair of N-channel MOSFETs.

3. A static memory according to claim 1, wherein said load elements comprises resistor elements comprised of a polycrystalline silicon film.

4. A static memory according to claim 2, wherein said load elements comprise P-channel MOSFETs each of which has a source-drain path coupled to the drain of the corresponding N-channel MOSFET.

5. A static memory according to claim 4, further comprising:
 supply means coupled to said plurality of pairs of complementary data lines and including first means for supplying a first voltage to one of the respective pair of complementary data lines and second means for supplying a second voltage to the other of the respective pair of complementary data lines, said first voltage being lower than said second voltage,
 wherein said simultaneous selection means in said selecting means brings said predetermined word lines into a selection state under a state where said first and second voltages are supplied to the respective pair of complementary data lines.

6. A static memory according to claim 5, further comprising:
 a first terminal to which a third voltage substantially identical with said first voltage is supplied; and
 a second terminal to which a fourth voltage substantially identical with said second voltage is supplied,
 wherein said first means includes first MOSFETs each of which has its source-drain path thereof coupled between said first terminal and one of the pair of complementary data lines, and
 wherein said second means includes second MOSFETs each of which has its source-drain path thereof coupled between said second terminal and the other of the pair of complementary data lines.

7. A static memory according to claim 6, wherein said first MOSFETs are N-channel MOSFETs, and wherein said second MOSFETs are P-channel MOSFETs.

8. A static memory according to claim 6, wherein both said first and second MOSFETs are N-channel MOSFETs.

9. A static memory according to claim 1, wherein a static memory cell coupled to one of said predetermined word lines and a static memory cell coupled to another one of said predetermined word lines are both coupled to one pair of complementary data lines of said pairs of complementary data lines.

10. A microcomputer including an arithmetic logic unit and a static memory coupled to said arithmetic logic unit via a bus, said static memory comprising:

a plurality of static type memory cells which store data therein;

a plurality of word lines and a plurality of pairs of complementary data lines coupled to said plurality of static type memory cells so that each static type memory cell is coupled to a word line and a pair of complementary data lines; and selecting means coupled to said plurality of word lines including decoder means responsive to address signals for selecting one of said plurality of word lines and further including simultaneous selection means responsive to a control signal for simultaneously bringing predetermined word lines into a selection state so that data stored in static type memory cells which are coupled to said predetermined word lines can be set at identical data.

11. A microcomputer according to claim 10, wherein said static memory is formed in a register group.

12. A microcomputer according to claim 10, wherein each of said plurality of static type memory cells comprises a flip-flop including a pair of inverters each of which has an N-channel MOSFET connected in series with a load element, said two inverters being cross-coupled with respect to their input and output, and a transmission MOSFET for coupling the input/output of the flip-flop to the complementary data line.

13. A microcomputer according to claim 12, wherein said load element is a resistor comprised of a polycrystalline silicon film.

14. A microcomputer according to claim 12, wherein said load element is a P-channel MOSFET having its gate coupled to a gate of said N-channel MOSFET.

15. A microcomputer according to claim 10, further comprising:

supply means coupled to said plurality of pairs of complementary data lines and including first means for supplying a first voltage to one of the respective pair of complementary data lines and second means for supplying a second voltage to the other of the respective pair of complementary data lines, said first voltage being lower than said second voltage, wherein said simultaneous selection means in said selecting means brings said predetermined word lines into a selection state under a state where said first and second voltages are supplied to the respective pair of complementary data lines.

16. A microcomputer according to claim 15, wherein said first means includes a first MOSFET having its source-drain path connected in series with one of the respective pair of complementary data lines, and wherein said second means include a second MOSFET having its source-drain path connected in series with the other of the respective pair of complementary data lines.

17. A microcomputer according to claim 16, wherein said first and second MOSFETs are N-channel type MOSFETs.

18. A microcomputer according to claim 16, wherein said first MOSFET is an N-channel type MOSFET, and wherein said second MOSFET is a P-channel type MOSFET.

19. A static memory according to claim 10, wherein a static memory cell coupled to one of said predetermined word lines and a static memory cell coupled to another one of said predetermined word lines are both coupled to one pair of complementary data lines of said pairs of complementary data lines.

20. An MOS static memory formed in a register group in a computer, said MOS static memory comprising:

a plurality of static type memory cells which store data therein;

a plurality of word lines and a plurality of pairs of complementary data lines coupled to said plurality of static type memory cells so that each static type memory cell is coupled to a word line and a pair of complementary data lines; and selecting means coupled to said plurality of word lines including decoder means responsive to address signals for selecting one of said plurality of word lines and further including simultaneous selection means responsive to a control signal for simultaneously bringing predetermined word lines into a selection state so that data stored in static type memory cells which are coupled to said predetermined word lines can be set at identical data.

21. An MOS static memory according to claim 20, wherein each of said plurality of static type memory cells comprises a flip-flop including a pair of inverters each of which has an N-channel MOSFET connected in series with a load element, said two inverters being cross-coupled with respect to their input and output, and a transmission MOSFET for coupling the input/output of the flip-flop to the complementary data line.

22. An MOS static memory according to claim 21, wherein said load element is a resistor comprised of a polycrystalline silicon film.

23. An MOS static memory according to claim 21, wherein said load element is a P-channel MOSFET having its gate coupled to a gate of said N-channel MOSFET.

24. An MOS static memory according to claim 20, further comprising:

supply means coupled to said plurality of pairs of complementary data lines and including first means for supplying a first voltage to one of the respective pair of complementary data lines and second means for supplying a second voltage to the other of the respective pair of complementary data lines, said first voltage being lower than said second voltage, wherein said simultaneous selection means in said selecting means brings said predetermined word lines into a selection state under a state where said first and second voltages are supplied to the respective pair of complementary data lines.

25. An MOS static memory according to claim 24, wherein said first means includes a first MOSFET having its source-drain path connected in series with one of the respective pair of complementary data lines, and wherein said second means includes a second MOSFET having its source-drain connected in series with the other of the respective pair of complementary data lines.

26. An MOS static memory according to claim 25, wherein said first and second MOSFETs are N-channel type MOSFETs.

27. An MOS static memory according to claim 25, wherein said first MOSFET is an N-channel type MOSFET, and wherein said second MOSFET is a P-channel type MOSFET.

28. A static memory according to claim 20, wherein a static memory cell coupled to one of said predetermined word lines and a static memory cell coupled to another one of said predetermined word lines are both coupled to one pair of complementary data lines of said pairs of complementary data lines.

29. In a microcomputer implemented in a semiconductor integrated circuit device, said microcomputer comprising an arithmetic logic unit and data registers coupled to said arithmetic logic unit via bus means for transmitting data between said arithmetic logic unit and said data registers, said data registers being constructed of an MOS static memory, said MOS static memory comprising:

a plurality of static type memory cells each of which store data therein;

a plurality of word lines and a plurality of pairs of data lines coupled to said plurality of static memory cells so that each static type memory cell is coupled to a word line and a pair of data lines; and selecting means coupled to said plurality of word lines including decoder means responsive to address signals for selecting one of said plurality of word lines in accordance with said address signals and further including simultaneous selection means responsive to a first control signal for simultaneously bringing predetermined word lines into a selection state in accordance with said control signal.

30. In a mocrocomputer according to claim 29, further comprising:

potential setting means coupled to said pair of data lines and responsive to a second control signal for setting potential levels of said predetermined pair of data lines so that the potential level of one of said predetermined pair of data lines is set at a predetermined high level and the potential level of the other of said predetermined pair of data lines is set at a predetermined low level in accordance with said second control signal, wherein said simultaneous selection means in said selecting means brings said predetermined word lines into the selection state under a state where said potential setting means set the potential levels of said predetermined pair of data lines at the predetermined high and low levels, respectively.

31. A static memory according to claim 29, wherein a static memory cell coupled to one of said predetermined word lines and a static memory cell coupled to another one of said predetermined word lines are both coupled to one pair of complementary data lines of said pairs of complementary data lines.

* * * * *